United States Patent
Moscicki

[19]

[11] Patent Number: 6,064,115
[45] Date of Patent: May 16, 2000

[54] SEMICONDUCTOR DEVICE PROVIDED WITH A HEAT SINK

[75] Inventor: Jean-Pierre Moscicki, Saint-Martin le Vinoux, France

[73] Assignee: SGS-Thomson Microelectronics S.A., Gentilly, France

[21] Appl. No.: 09/083,808

[22] Filed: May 22, 1998

[51] Int. Cl.[7] ............ H01L 23/34; H01L 23/48; H01L 29/40; H05K 7/20

[52] U.S. Cl. ............ 257/706; 257/707; 257/712; 257/675; 257/796; 257/717

[58] Field of Search .................. 257/706, 707, 257/712, 713, 720, 717, 675, 796

[56] References Cited

U.S. PATENT DOCUMENTS

| | | | |
|---|---|---|---|
| 3,825,803 | 7/1974 | Budde | 257/712 |
| 3,996,447 | 12/1976 | Bouffard et al. | 219/541 |
| 5,229,918 | 7/1993 | Bosca et al. | 361/710 |
| 5,278,446 | 1/1994 | Nagaraj et al. | 257/707 |
| 5,345,106 | 9/1994 | Doering et al. | 257/675 |
| 5,381,042 | 1/1995 | Lerner et al. | 257/712 |
| 5,430,331 | 7/1995 | Hamzehdoost et al. | 257/796 |
| 5,596,231 | 1/1997 | Combs | 257/776 |
| 5,666,003 | 9/1997 | Shibata et al. | 257/796 |
| 5,705,851 | 1/1998 | Mostafazadeh et al. | 257/675 |
| 5,723,899 | 3/1998 | Shin | 257/666 |
| 5,757,070 | 5/1998 | Fritz | 257/675 |
| 5,790,378 | 8/1998 | Chillara | 361/719 |
| 5,801,435 | 9/1998 | Otsuki | 257/675 |
| 5,895,966 | 4/1999 | Penchuk | 257/690 |
| 5,936,303 | 8/1999 | Nishi | 257/675 |

FOREIGN PATENT DOCUMENTS

WO 94/06154  3/1994  WIPO ............ H01L 23/433

OTHER PUBLICATIONS

Patents Abstracts of Japan, vol. 014, No. 065 (E–0961), Aug. 8, 1990 & JP 02 129951 (Hitachi Ltd).
Patents Abstracts of Japan, vol. 014, No. 082 (E–0889), Feb. 15, 1990 & JP 01 293551 (Mitsubishi Electric).
Patents Abstracts of Japan, vol. 014, No. 524 (E–1003), Nov. 16, 1990 & JP 02 222166 (Toppan Printing Co. Ltd.).
Patents Abstracts of Japan, vol. 017, No. 484 (E–1426), Sep. 2, 1993 & JP 05 121632 (NEC Corp.).
Patents Abstracts of Japan, vol. 007, No. 258 (E–211), Nov. 17, 1983 & JP 58 143558.

*Primary Examiner*—Alexander Oscar Williams
*Attorney, Agent, or Firm*—Theodore E. Galanthay; Allen, Dyer, Doppelt, Milbrath & Gilchrist, P.A.

[57] ABSTRACT

A semiconductor device includes a chip forming an integrated circuit, an electrical leadframe, and a heat sink. The passive face of the chip is fixed by adhesive bonding to a bearing face of the heat sink. The leadframe has a central opening giving it the shape of a central leadframe ring, which extends around the chip and which is fixed so as to bear on the bearing face of the heat sink. The central leadframe ring is fixed by soldering to the bearing face of the heat sink respectively at four points far from the corners of the central leadframe ring. The bearing face of the heat sink has alignment and fixing studs which project and are engaged in through-passages in the central leadframe ring.

48 Claims, 7 Drawing Sheets

SEMICONDUCTOR DEVICE PROVIDED WITH A HEAT SINK

FIELD OF THE INVENTION

The present invention relates to the field of semiconductor devices, and, more particularly, to integrated circuits embedded in an encapsulant forming a package. The integrated circuit may include electrical connection wires connecting the active face of the chip to an electrical leadframe having electrical connection leads projecting to the outside of the encapsulant and providing leads for subsequent connection, for example, to traces or tracks on a printed-circuit board.

BACKGROUND OF THE INVENTION

In the current state of the art, the electrical leadframe for an encapsulated integrated circuit comprises a central plate to which the passive face of the chip forming the integrated circuit is fixed by adhesive bonding. The connection leads are placed around the periphery of this central plate. When in particular the chip forms a power integrated circuit, it is known to couple it to a heat sink to absorb and dissipate the heat which it produces. The following solutions have been proposed to overcome difficulties with such power integrated circuits.

One known arrangement includes fixing the heat sink to that face of the central plate of the electrical leadframe on the opposite side from its face which receives the chip by adhesive bonding. In another known arrangement, the heat sink is no longer fixed by adhesive bonding but, at its four corners, has projecting studs which pass through the corners of the central plate. Those ends of the studs lying on the same side as the chip are crimped, by crushing, perpendicularly to the central plate.

In another known arrangement, the heat sink is not fixed to the electrical leadframe, but is placed in the bottom cavity of the mold into which the encapsulant is injected. The central plate of the leadframe is placed on top and in contact with it, before injecting the encapsulant, and after the mold has been closed.

Up to now, the known arrangements described above, applied to large packages, have given relatively satisfactory results with regard to dissipation of the heat produced. However, they are becoming increasingly limited from the standpoint of their capacity to dissipate the heat produced by the integrated circuit and unsuitable from a constructional and fabrication-process standpoint when it is a question of fabricating semiconductor devices in which the electronic functions are ever increasing. Moreover, the number of connections are ever increasing and may be as many as 208, and the required size of which is ever decreasing, as is the case in many electrical systems, such as microcomputers and portable telephones.

SUMMARY OF THE INVENTION

The object of the present invention is to provide a semiconductor device capable of having an increased capacity to dissipate the heat produced by the integrated circuit, while still maintaining, or even improving, its mechanical and electrical connection properties.

The present invention is directed first of all to a semiconductor device comprising a chip forming an integrated circuit, an electrical leadframe, having in particular a central plate, and a heat sink. The passive face of the chip is fixed, preferably by adhesive bonding, to a bearing face of the heat sink and the central plate of the leadframe has a central ring.

The central leadframe ring extends around the chip and is fixed so as to bear on the bearing face of the heat sink. The central leadframe ring is preferably fixed at discrete points to the bearing face of the heat sink. Also according to the invention, the branches of this central leadframe ring are preferably fixed, in particular by soldering, to the bearing face of the heat sink respectively at a point far from the corners of this central leadframe ring.

The bearing face of the heat sink advantageously has alignment and fixing studs which project and are engaged in through-passages in the central leadframe ring. The through-passages in the central leadframe ring are preferably provided at the corners of this ring and the studs act on the central leadframe ring towards the outside, approximately along the corresponding diagonal of the central leadframe ring. The projecting ends of the studs are preferably deformed towards the outside, approximately along the corresponding diagonal of the central leadframe ring.

Also in accordance with the invention, the through-passages in the central leadframe ring are preferably in the form of a V or a U which open towards the inside, the tip of which is directed towards the outside approximately along the corresponding diagonal of the central leadframe ring. In addition, the studs preferably have a circular cross-section, and the studs are preferably placed approximately at the intersection of the axes of the corresponding branches of the leadframe ring.

In one variant of the invention, the bearing face of the heat sink has a planar shape. In another variant, the bearing face of the heat sink has a shoulder around which the central leadframe ring is placed. The thickness of the shoulder is preferably less than or equal to the thickness of the central leadframe ring.

An internal edge of the central leadframe ring preferably lies some predetermined distance from the periphery of the chip. In addition, that face of the central leadframe ring which faces the heat sink is fixed to the latter, preferably by soldering. The heat sink may advantageously have lateral cavities through which the soldering of the central leadframe ring is carried out.

The central opening in the central leadframe ring may be obtained by cutting or by punching. The face via which this punching is carried out may be placed so as to bear on the bearing face of the heat sink. The perimeter of the bearing face of the heat sink preferably follows the perimeter of the leadframe ring.

The leadframe may furthermore comprise connection leads lying around the periphery of the leadframe ring and connection wires. The ends of the connection wires may be selectively bonded to the active face of the chip, to the leadframe ring, and to the connection leads. The whole assembly may be embedded in an encapsulant so that the connection leads project to the outside of this encapsulant.

That face of the heat sink which is on the opposite side from its bearing face receiving the chip may advantageously project beyond or be flush with, at least in part, the outside of the encapsulant. The periphery of the layer of adhesive connecting the chip to the heat sink is preferably some distance from the internal peripheral edge of the leadframe ring. The adhesive connecting the chip to the heat sink is preferably made of an electrically conductive and thermally conductive material.

The present invention is also directed to a process for fabricating an integrated-circuit semiconductor device, which includes, in particular, adhesive bonding to a bearing face of a heat sink; placing a central ring of an electrical leadframe around the chip and at some distance therefrom, so as to bear on the bearing face of the heat sink, by engaging alignment and fixing studs, which are provided so as to project from the bearing face of the heat sink, through the through-passages of the leadframe ring which are provided in the corners of this leadframe ring; soldering each branch of the leadframe ring to the heat sink at a single point far from the corners of this leadframe ring; and after this soldering operation, crimping the leadframe onto the heat sink by deforming the alignment and fixing studs towards the outside, approximately along the corresponding diagonal of the leadframe ring, so as to produce a tensile force in the branches of the leadframe ring between the soldering points and the alignment and fixing studs. The process according to the invention furthermore preferably includes soldering the heat sink to that face of the leadframe ring which faces the heat sink.

BRIEF DESCRIPTION OF THE DRAWINGS

The present invention will be more clearly understood on studying a semiconductor device, comprising a chip forming an integrated circuit, an electrical leadframe, electrical connection wires, and a heat sink, these being embedded in an encapsulant, described by way of non-limiting example and illustrated, in which.

DETAILED DESCRIPTION OF THE PREFERRED EMBODIMENTS

Figure 1:
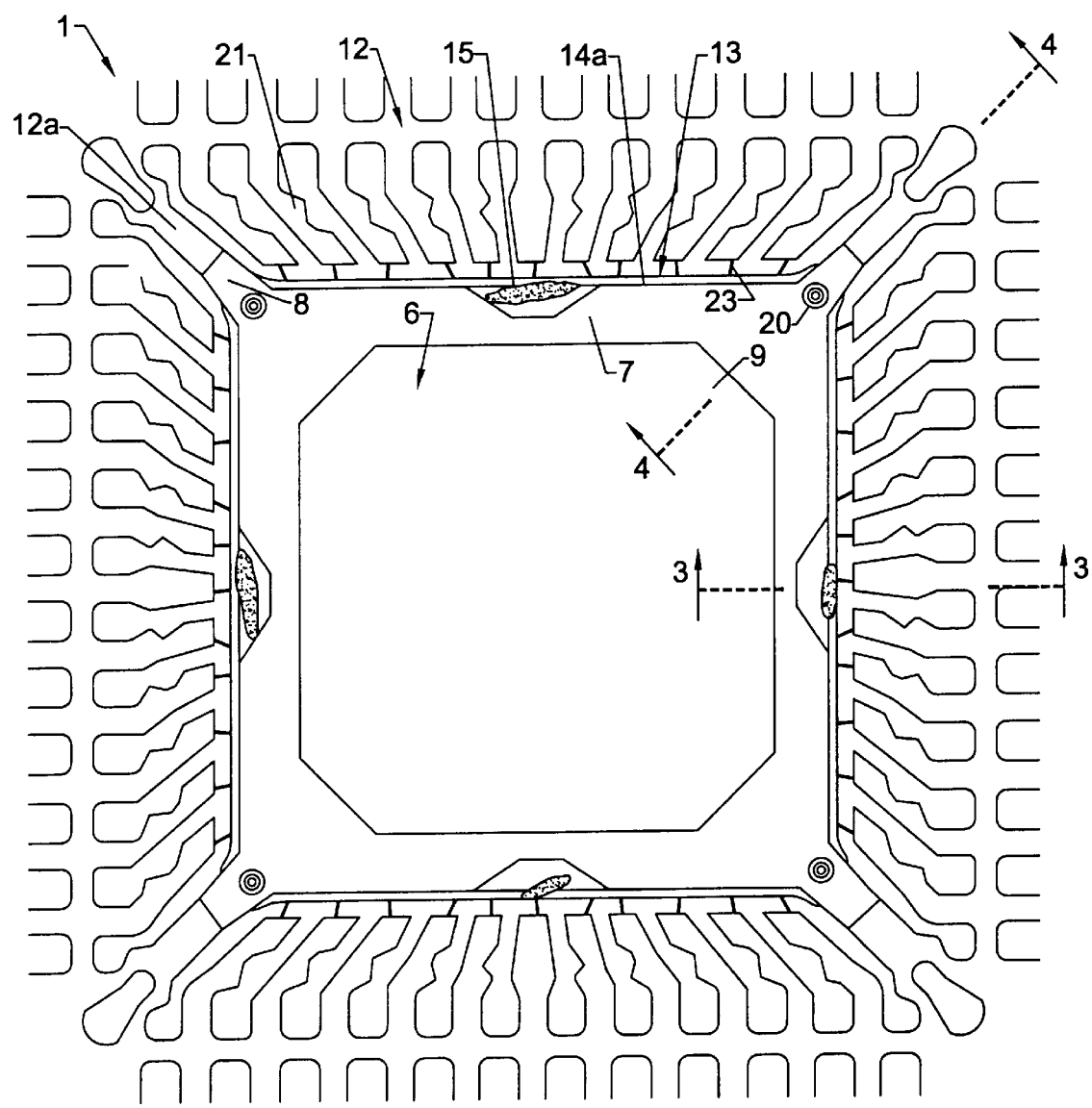
FIG. 1 represents a rear view of a semiconductor device according to the invention, without the encapsulant.
Figure 2:
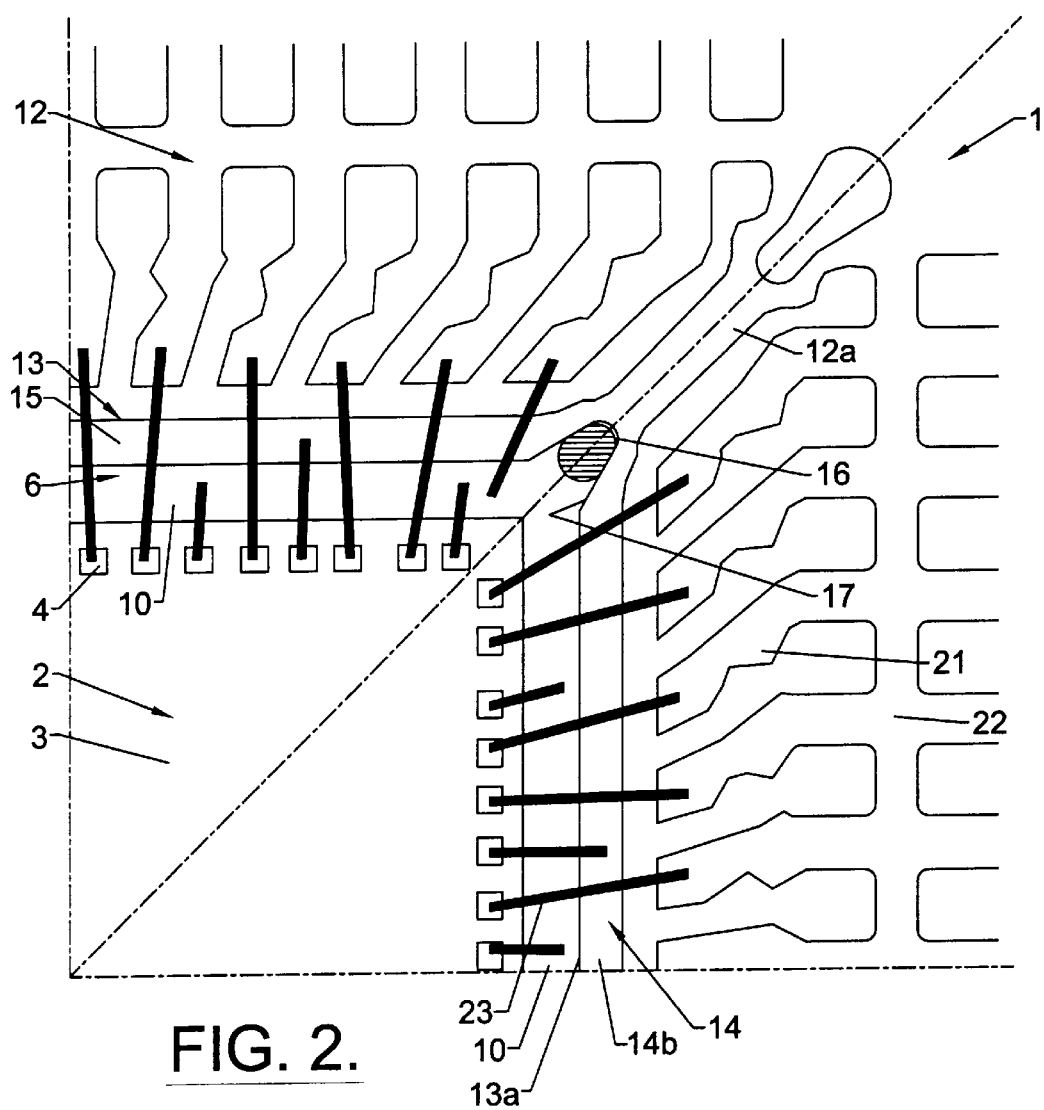
FIG. 2 represents a quarter of a front view of the semiconductor device shown in FIG. 1, without the encapsulant.
Figure 3:
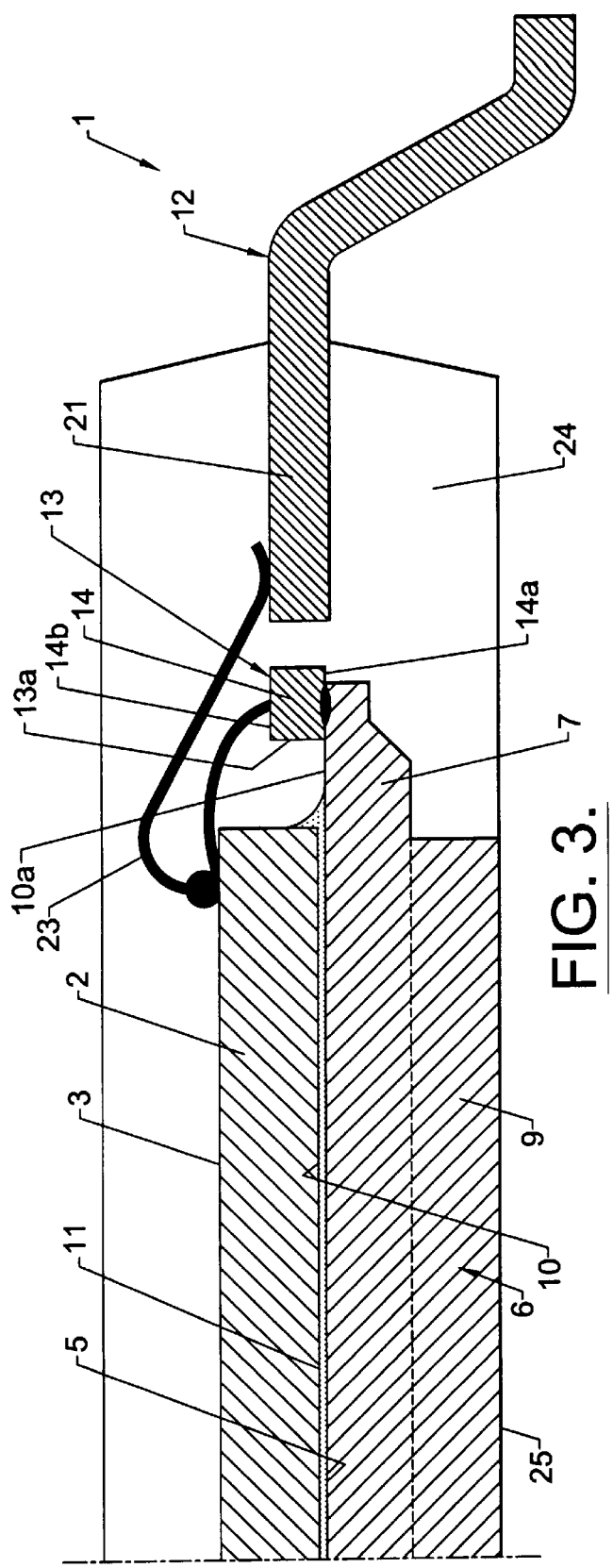
FIG. 3 represents a partial median section taken along lines III—III in FIG. 1 of the aforementioned semiconductor device, with its encapsulant.
Figure 4:
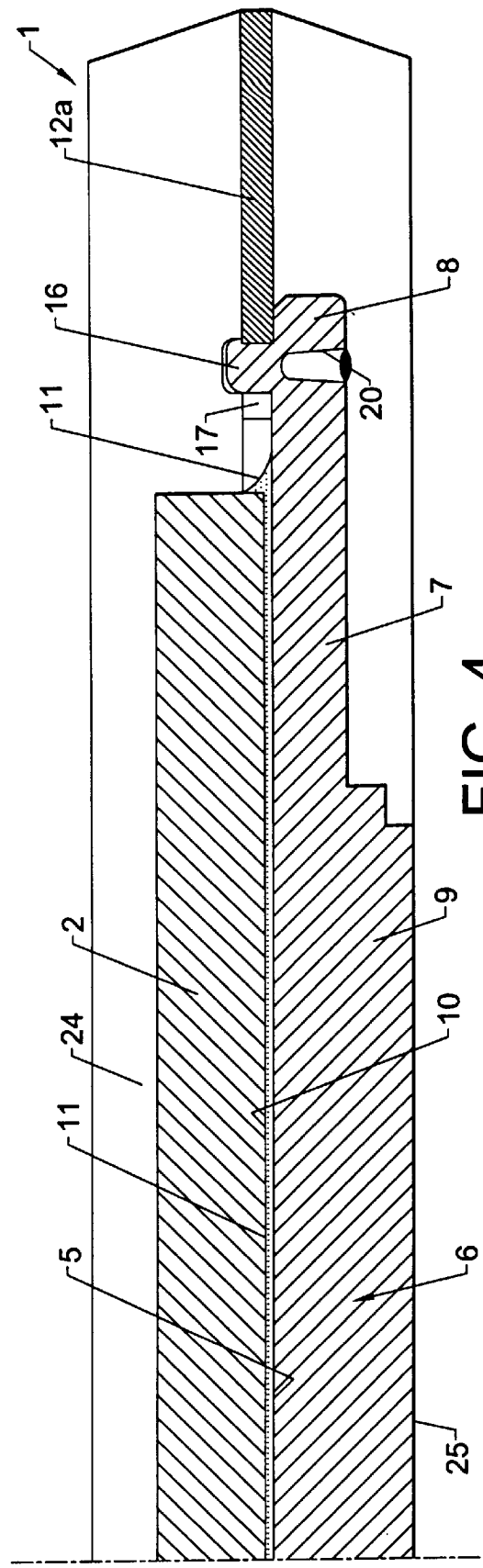
FIG. 4 represents a section taken along lines IV—IV in FIG. 1, corresponding to a diagonal, of the aforementioned semiconductor device, with its encapsulant.
Figure 5:
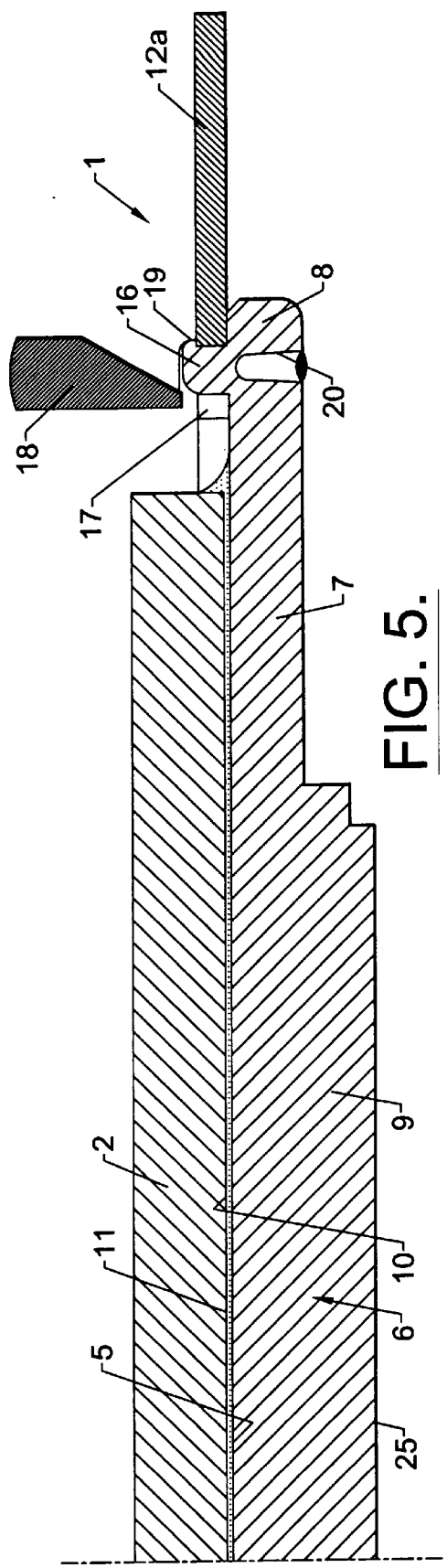
FIG. 5 represents a section of the aforementioned semiconductor device, without its encapsulant, corresponding to FIG. 4, showing one fabrication step.

The device shown in FIGS. 1 to 5, identified in a general way by the reference 1, comprises a chip 2 forming an integrated circuit, which, in the example described, is square and comprises an active face 3 which has along its edges a multiplicity of electrical connection pads 4 arid, on the opposite side, a passive face 5. The semiconductor device 1 also comprises a heat sink 6, for example, made of copper, which is in the form of a flat block.

In the example, this heat sink 6 has a square front part 7, provided at its four corners with short projecting extensions 8 which extend along the diagonals, and a rear part 9, the peripheral shape of which is smaller than that of its front part 7. The front face 10 of the front part 7 of the heat sink 6 is flat over its entire surface and provides a bearing face at the center of which the passive face 5 of the chip 2 is fixed by means of a thin layer of adhesive 11 having thermal and electrical connection properties. The front bearing face 10 of the heat sink 6 is larger than the chip 2 so as to leave, around the latter, a uniform peripheral region 10a free of adhesive 11.

The semiconductor device 1 furthermore comprises a leadframe, identified in the general way by the reference 12, which comprises a central leadframe ring 13 which has four branches 14. The branches 14 are in pairs opposite and parallel to each other, and may be obtained by chemical cutting or by punching of a square opening 13a in the central part of a central square leadframe plate of the leadframe 12. The leadframe 12 comprises four straps 12a which extend along its diagonals arid carry the four corners of the central leadframe ring 13. The size of the central leadframe ring 13 is such that its branches 14 may be placed so as to bear on the peripheral bearing region 10a of the bearing face 10 of the heat sink 6, around and at a uniform distance from the periphery of the chip 2.

Depending on the requirements, the peripheral edge of the central leadframe ring 13 may be provided so as to coincide with the edge of the bearing face of the heat sink 6 or may extend not as far as this or may extend beyond this. In the example shown, the central leadframe ring 13 projects slightly all around the bearing face 10 of the heat sink 6. The central leadframe ring 13 is fixed at discrete points to the bearing face 5 of the heat sink 6 in the middle of its four branches 14 and to its four corners in the following manner.

By heating the mid-points 15 of the rear faces 14a of the four branches 14 of the central leadframe ring 13, for example, using a laser, they are soldered to the bearing face 10 of the heat sink 6. Thus, the front face 14b of the central leadframe ring 13, rendered solderable by a coating of silver, gold or palladium, cannot be damaged while these soldered joints 15 are being produced.

In order to fix the four corners of the central leadframe ring 13 to the heat sink 6, the bearing face 10 of the latter has four projecting alignment and fixing studs 16, provided in the region of the extensions 8, which extend through the through-passages 17 made in the corners of the central leadframe ring 13, in the regions of intersection of the axes of the straps 12a and of the corresponding branches 14. In the example, the studs 16 have a circular cross-section and the through-passages 17 are open towards the inside of the ring and have the shape of a U or a V having branches open towards the inside.

As shown in PIG. 5, the ends of the studs 16 are deformed towards the outside along the diagonals of the central leadframe ring 13, for example, using a crimping tool 18, in such a way that the studs 16 bear laterally on the bottom of the through-passages 17 in the central leadframe ring 13 and so that they have a part 19 extending towards the outside above the central leadframe ring 13 in the direction of the straps 12a. Thus, a more or less balanced tensile force is advantageously produced in those portions of the branches 14 of the central leadframe ring 13 respectively between the soldering points 15 and the corresponding studs 16. The central leadframe ring 13 is also advantageously held against the bearing face 10 of the heat sink 6 by virtue of the projecting parts 19 of the ends of the studs 16. However, a certain freedom of movement, by the central leadframe ring 13 sliding on the bearing face 10 of the heat sink 6, may be provided. In one embodiment, the studs 16 may be obtained by stamping the heat sink 6 using a tool, not shown, which produces recesses 20 in the heat sink 6 opposite the studs 16.

The leadframe 12 also comprises a multiplicity or plurality of connection leads 21 which extend around the periphery of the central leadframe ring 13 and at some distance therefrom. The external ends of the connection leads 21 are carried by peripheral strips 22 which also carry the external ends of the straps 12a and which are intended to be subsequently separated. The semiconductor device 1 furthermore comprises a multiplicity or plurality of electrical connection wires 23 which selectively connect, depending on the requirements, the pads 4 on the chip 2, the front face 14b of the central leadframe ring 13 and the front faces of the electrical connection leads 21, these being treated over almost their entire length so as to be solderable.

The semiconductor device 1 furthermore comprises a resin encapsulant 24 overmolded so that only the external end parts of the electrical connection leads 21 project to the outside and in such a way that the rear face 25 of the heat sink 6, opposite its bearing face 10, emerges on the outside, being flush with its rear face.

The semiconductor device 1 just described may be fabricated in the following manner. The chip 2 is fixed to the heat sink 6 by means of the adhesive 11. All the following wire connections are then made: chip 2 to the ring 13, chip 2 to the leads 21, and ring 13 to the leads 21.

Next, the central leadframe ring 13 is placed around and at some distance from the chip, engaging the alignment and fixing studs 16 through the through-passages 17 in the central leadframe ring 13. The four points 15 in the middle of the branches 14 of the central leadframe ring 13 are then soldered.

In a step after this soldering operation, the studs 16 are crimped, by deforming them towards the outside, along the corresponding diagonal of the central leadframe ring 13. The whole assembly thus produced is placed in a mold and the encapsulating resin 25 is injected, this encapsulating resin providing, after curing, a semiconductor package.

In one particularly advantageous arrangement, it is desirable to place the leadframe 12 in a position such that its face, via which the central opening 13a in its leadframe 13 is produced by punching, bears against the bearing face 10 of the heat sink 6. Thus, the flash which may be produced in the corner of its opposite face lies at some distance from the bearing face 10 of the heat sink 6 and can in no way impair the contact between the Central leadframe ring 13 and this bearing face 10.

Figure 6:
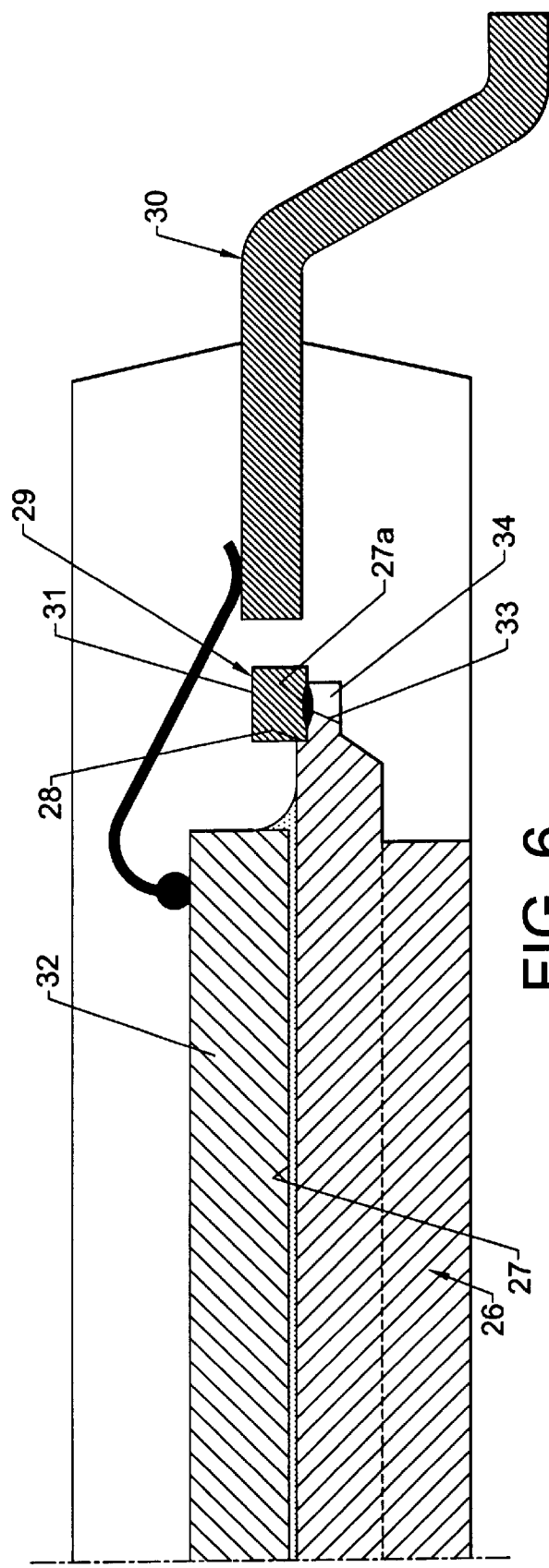
FIGS. 6 and 7 represent views corresponding to FIGS. 3 and 5 of an alternative embodiment of a semiconductor device according to the invention.
Figure 7:
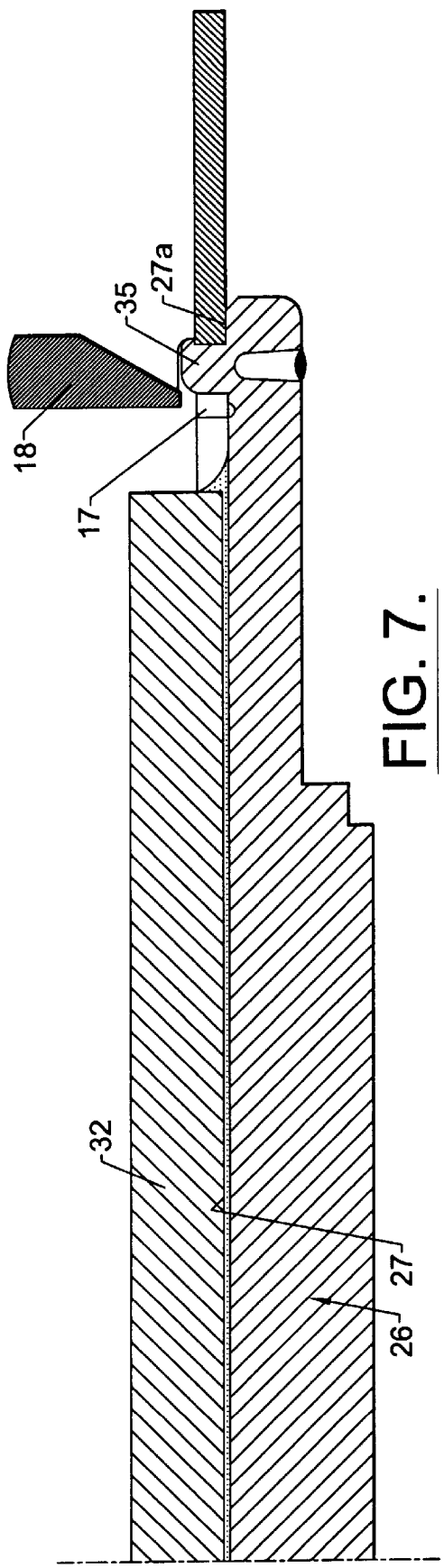

Referring now to FIGS. 6 and 7, it may be seen that, in this variant, the peripheral part of a heat sink 26, which is moreover identical to the heat sink 6, has, in its front bearing face 27, a peripheral shoulder 28 which defines a set-back front peripheral bearing face 27a. The central leadframe ring 29 of an electrical leadframe 30, for example, identical to the electrical leadframe 12, is placed around the shoulder 28 and in contact with it on the peripheral bearing face 27a.

The height of the shoulder 28 is such that the front face 31 of the central leadframe ring 29 is above and at some distance from the central part of the bearing face 27 to which the chip 32 is fixed. Thus, the adhesive for fixing the chip 32 cannot reach this front face 31.

As in the previous example, the central leadframe ring 29 is fixed by four central soldering points 33 to the offset bearing face 27a of the heat sink 26, the latter having, over its height, corresponding lateral cavities 34 which facilitate the soldering. As in the previous example, the offset bearing face 27a of the heat sink 26 has four projecting studs which engage with the corners of the central leadframe ring 29.

The semiconductor device just described is particularly suitable for the production of thin semiconductor packages, possibly having a large number of connections on its four sides, capable of dissipating the thermal power produced by the chip, which may be as much as 5 watts. In one embodiment, the heat sink, for example made of copper, may have a thickness of between 0.5 and 0.6 mm. The leadframe may have a thickness of between 0.12 and 0.15 mm and the central leadframe ring may have a width of between 0.2 and 0.4 mm and a central openings having a side of between 4 and 12 mm. The studs 16 may have a diameter of between 0.1 and 0.3 mm. The chip may have a between 3 and 11 mm. The distance between the internal edge of the central leadframe ring 13 and the periphery of the chip 2 may thus be between 0.2 and 4 mm. The package may therefore have a thickness of approximately 1.4 mm and a side of approximately 14 mm.

The semiconductor device just described has many advantages. By virtue of the direct contact of the heat sink 6 against the chip 2, over the entire surface area of its passive face 5, solely by means of the thin layer of suitable adhesive 11, the heat produced by this chip is dissipated. The adhesive 11 cannot contaminate either the region where the central leadframe ring 13 bears on the heat sink 6 nor its front face 14b onto which electrical connection wires are bonded. In addition, during the bonding, the central leadframe ring 13 is bearing correctly on the front face of the heat sink 6.

The electrical properties of the adhesive 11 ensure that there is electrical connection between the rear face of the chip 3 and the heat sink 6. Contact between the central leadframe 13 and the bearing face 10 of the heat sink 6 is provided all around the periphery by means of the central soldering points 15 and the corner studs 16, while still allowing a certain freedom of movement of the free parts of the branches of this central leadframe ring 13. This freedom of movement makes it possible to absorb the thermodynamic stresses likely to appear, on the one hand, during injection of the encapsulant 25, which takes place at a temperature of about 185° C., and during its polymerization and, on the other hand, during the subsequent use of the semiconductor package produced, at various temperatures.

The proposed structure furthermore makes it possible to avoid any delamination between the encapsulant and, on the one hand, the connection faces of the electrical leadframe and, on the other hand, the bonded joints of the connection wires, in particular of the ground wires bonded to the central leadframe ring 13. In fact, the proposed semiconductor device allows greater heat dissipation to be obtained while decreasing the risks of defects appearing, such as cracking in the electrical connection wire bonded joints, and the risks of the encapsulant delaminating.

The proposed device allows connection of the so-called ground wires over the entire length of each of the branches of the ring. It allows isolation from impedance coupling between two wires carrying high-frequency switching signals.

That which is claimed is:

1. A semiconductor device comprising:

a chip forming an integrated circuit and having a passive face;

an electrical leadframe comprising a central leadframe ring and connection leads lying around a periphery of the central leadframe ring, the connection leads comprising end portions substantially co-planar with the central leadframe ring; and a heat sink having a bearing face fixed to the passive face of said chip, said heat sink further comprising alignment and fixing studs extending from the bearing face thereof;

said central leadframe ring having a central opening therein which extends around said chip, said central leadframe ring having through-passages therein receiving said alignment and fixing studs so that said central leadframe ring is fixed to bear on the bearing face of said heat sink, the through-passages of said central leadframe ring being provided at the corners thereof.

2. A semiconductor device according to claim 1, further comprising adhesive bonding the passive face of said chip to the bearing face of said heat sink.

3. A semiconductor device according to claim 1, wherein the central leadframe ring is fixed at discrete points to the bearing face of said heat sink.

4. A semiconductor device according to claim 1, wherein said leadframe further comprises branches fixed to the bearing face of said heat sink at respective points spaced from the corners of the central leadframe ring.

5. A semiconductor device according to claim 4 wherein the branches are fixed by solder.

6. A semiconductor device according to claim 1, wherein said alignment and fixing studs act on the central leadframe ring towards the outside, approximately along a corresponding diagonal of the central leadframe ring.

7. A semiconductor device according to claim 6, wherein the alignment and fixing studs include projecting ends; and wherein the projecting ends of the said alignment and fixing studs are deformed towards the outside, approximately along the corresponding diagonal of the central leadframe ring.

8. A semiconductor device according to claim 1, wherein said through-passages of the central leadframe ring are in the form of a V or a U which open towards the inside, and a tip of which is directed towards the outside approximately along the corresponding diagonal of the central leadframe ring.

9. A semiconductor device according to claim 1, wherein said alignment and fixing studs have a circular cross-section.

10. A semiconductor device according to claim 1, wherein said leadframe further comprises branches fixed to the bearing face of said heat sink; and wherein said alignment and fixing studs are placed approximately at a point of intersection of axes of the corresponding branches of the central leadframe ring.

11. A semiconductor device according to claim 1, wherein the bearing face of said heat sink has a planar shape.

12. A semiconductor device according to claim 1, wherein the bearing face of said heat sink has a peripheral shoulder around which the central leadframe ring is placed.

13. A semiconductor device according to claim 12, wherein a thickness of the shoulder is less than or equal to a thickness of the central leadframe ring.

14. A semiconductor device according to claim 1, wherein an internal edge of the central leadframe ring lies a predetermined distance from a periphery of the chip.

15. A semiconductor device according to claim 1, wherein a face of the central leadframe ring which faces the heat sink is fixed thereto.

16. A semiconductor device according to claim 15, wherein the face of the central leadframe ring is fixed by solder to said heat sink.

17. A semiconductor device according to claim 1, wherein said heat sink has lateral cavities through which soldering of the central leadframe ring is facilitated.

18. A semiconductor device according to claim 1, wherein the central opening in said central therefore is obtained by punching; and wherein a face via which this punching is carried out is placed so as to bear on the bearing face of said heat sink.

19. A semiconductor device according to claim 1, wherein a perimeter of the bearing face of said heat sink follows a perimeter of the central leadframe ring.

20. A semiconductor device according to claim 1, wherein said electrical leadframe furthermore comprises connection wires; wherein ends of the connection wires are selectively bonded to an active face of said chip opposite the passive face, to the central leadframe ring, and to the connection leads; and further comprising an encapsulant embedding said electrical leadframe so that the connection leads project to an outside of said encapsulant.

21. A semiconductor device according to claim 20, wherein a face of said the heat sink which is opposite the bearing face projects beyond or is flush with, at least in part, the outside of said encapsulant.

22. A semiconductor device according to claim 1, wherein said leadframe further comprises branches fixed to the bearing face of said heat sink; and wherein a front face of the central leadframe ring is treated so as to be solderable, at least in part, over a length of said branches.

23. A semiconductor device according to claim 1, further comprising adhesive bonding the passive face of said chip to the bearing face of said heat sink; and wherein the adhesive has a periphery lying a predetermined distance from an internal peripheral edge of the central leadframe ring.

24. A semiconductor device according to claim 1, further comprising adhesive bonding the passive face of said chip to the bearing face of said heat sink; and wherein said adhesive comprises an electrically conductive and thermally conductive material.

25. A semiconductor device comprising:
a chip having a passive face;
an electrical leadframe comprising a central leadframe ring and connection leads lying around a periphery of the central leadframe ring, the connection leads comprising end portions substantially co-planar with the central leadframe ring; and
a heat sink having a bearing face fixed to the passive face of said chip, said heat sink further comprising alignment and fixing studs extending from the bearing face thereof;
said central leadframe ring having a central opening therein which extends around said chip, the central leadframe ring having through-passages therein receiving said alignment and fixing studs so that the central leadframe ring is fixed to bear on the bearing face of said heat sink.

26. A semiconductor device according to claim 25, further comprising adhesive bonding the passive face of said chip to the bearing face of said heat sink.

27. A semiconductor device according to claim 25, wherein the central leadframe ring is fixed at discrete points to the bearing face of said heat sink.

28. A semiconductor device according to claim 25, wherein said leadframe further comprises branches fixed to the bearing face of said heat sink at respective points far from the corners of the central leadframe ring.

29. A semiconductor device according to claim 28, wherein the branches are fixed by solder.

30. A semiconductor device according to claim 25, wherein the through-passages of the central leadframe ring are provided at the corners thereof; and wherein said alignment and fixing studs act on the central leadframe ring towards the outside, approximately along a corresponding diagonal of the central leadframe ring.

31. A semiconductor device according to claim 30, wherein the alignment and fixing studs include projecting ends; and wherein the projecting ends of the said alignment and fixing studs are deformed towards the outside, approximately along the corresponding diagonal of the central leadframe ring.

32. A semiconductor device according to claim 25, wherein said through-passages of the central leadframe ring are in the form of a V or a U which open towards the inside, and a tip of which is directed towards the outside approximately along the corresponding diagonal of the central leadframe ring.

33. A semiconductor device according to claim 25, wherein said alignment and fixing studs have a circular cross-section.

34. A semiconductor device according to claim 25, wherein said leadframe further comprises branches fixed to the bearing face of said heat sink; and wherein said alignment and fixing studs are placed approximately at a point of intersection of axes of the corresponding branches of the central leadframe ring.

35. A semiconductor device according to claim 25, wherein the bearing face of said heat sink has a planar shape.

36. A semiconductor device according to claim 25, wherein the bearing face of said heat sink has a peripheral shoulder around which the central leadframe ring is placed.

37. A semiconductor device according to claim 36, wherein a thickness of the shoulder is less than or equal to a thickness of the central leadframe ring.

38. A semiconductor device according to claim 25, wherein an internal edge of the central leadframe ring lies a predetermined distance from a periphery of the chip.

39. A semiconductor device according to claim 25, wherein a face of the central leadframe ring which faces the heat sink is fixed thereto.

40. A semiconductor device according to claim 39, wherein the face of the central leadframe ring is fixed by solder to said heat sink.

41. A semiconductor device according to claim 25, wherein said heat sink has lateral cavities through which soldering of the central leadframe ring is facilitated.

42. A semiconductor device according to claim 25, wherein the central opening in said central leadframe ring is obtained by punching; and wherein a face via which this punching is carried out is placed so as to bear on the bearing face of said heat sink.

43. A semiconductor device according to claim 25, wherein a perimeter of the bearing face of said heat sink follows a perimeter of the central leadframe ring.

44. A semiconductor device according to claim 25, wherein said electrical leadframe furthermore comprises connection wires; wherein ends of the connection wires are selectively bonded to an active face of said chip opposite the passive face, to the central leadframe ring and to the connection leads; and further comprising an encapsulant embedding said electrical leadframe so that the connection leads project to an outside of said encapsulant.

45. A semiconductor device according to claim 44, wherein a face of said the heat sink which is opposite the bearing face projects beyond or is flush with, at least in part, the outside of said encapsulant.

46. A semiconductor device according to claim 25, wherein said leadframe further comprises branches fixed to the bearing face of said heat sink; and wherein a front face of the central leadframe ring is treated so as to be solderable, at least in part, over a length of said branches.

47. A semiconductor device according to claim 25, further comprising adhesive bonding the passive face of said chip to the bearing face of said heat sink; and wherein the adhesive has a periphery lying a predetermined distance from an internal peripheral edge of the central leadframe ring.

48. A semiconductor device according to claim 25, further comprising adhesive bonding the passive face of said chip to the bearing face of said heat sink; and wherein said adhesive comprises an electrically conductive and thermally conductive material.

* * * * *